United States Patent
Carcasi et al.

(10) Patent No.: US 9,613,801 B2
(45) Date of Patent: Apr. 4, 2017

(54) INTEGRATION OF ABSORPTION BASED HEATING BAKE METHODS INTO A PHOTOLITHOGRAPHY TRACK SYSTEM

(71) Applicant: Tokyo Electron Limited, Tokyo (JP)

(72) Inventors: Michael A. Carcasi, Austin, TX (US); Mark H. Somervell, Austin, TX (US); Benjamen M. Rathsack, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/858,568

(22) Filed: Sep. 18, 2015

(65) Prior Publication Data

US 2016/0013052 A1 Jan. 14, 2016

Related U.S. Application Data

(63) Continuation of application No. 14/211,215, filed on Mar. 14, 2014, now abandoned.

(Continued)

(51) Int. Cl.
| | | |
|---|---|---|
| *H01L 21/00* | (2006.01) |
| *H01L 21/02* | (2006.01) |
| *H01L 21/027* | (2006.01) |
| *B81C 1/00* | (2006.01) |
| *G03F 7/00* | (2006.01) |

(Continued)

(52) U.S. Cl.
CPC .... *H01L 21/02345* (2013.01); *B81C 1/00031* (2013.01); *G03F 7/0002* (2013.01); *H01L 21/0271* (2013.01); *H01L 21/02118* (2013.01); *H01L 21/268* (2013.01); *H01L 22/20* (2013.01);

(Continued)

(58) Field of Classification Search
CPC ......... H01L 21/02345; H01L 21/02348; H01L 21/02118; H01L 21/268
See application file for complete search history.

(56) References Cited

U.S. PATENT DOCUMENTS

| | | |
|---|---|---|
| 5,344,742 A | 9/1994 | Sinta et al. |
| 5,650,261 A | 7/1997 | Winkle |

(Continued)

FOREIGN PATENT DOCUMENTS

| | | |
|---|---|---|
| CN | 101681812 A | 3/2010 |
| DE | 102012105384 A1 | 9/2012 |

(Continued)

OTHER PUBLICATIONS

Zhang et al., Fast Assembly of ordered Block Copolymer Nanostructures through Microwave Annealing, ACS Nano, vol. 4, No. 11, 2010.*

(Continued)

*Primary Examiner* — Reema Patel
*Assistant Examiner* — Syed Gheyas
(74) *Attorney, Agent, or Firm* — Wood Herron & Evans LLP

(57) ABSTRACT

A method of patterning a layered substrate is provided that includes forming a layer of a block copolymer on a substrate, annealing the layer of the block copolymer to affect microphase segregation such that self-assembled domains are formed, and annealing the layer of the block copolymer a second time to refine or modify the microphase segregation, where one of the annealing steps uses an absorption based heating method.

18 Claims, 1 Drawing Sheet

Related U.S. Application Data

(60) Provisional application No. 61/782,133, filed on Mar. 14, 2013.

(51) Int. Cl.
*H01L 21/268* (2006.01)
*H01L 21/28* (2006.01)
*H01L 21/66* (2006.01)

(52) U.S. Cl.
CPC *B81C 2201/0149* (2013.01); *H01L 21/28123* (2013.01); *H01L 22/12* (2013.01)

(56) References Cited

U.S. PATENT DOCUMENTS

| | | |
|---|---|---|
| 6,303,477 B1 | 10/2001 | Ianovitch |
| 6,855,476 B2 | 2/2005 | Ferreira et al. |
| 7,521,094 B1 | 4/2009 | Cheng et al. |
| 7,579,278 B2 | 8/2009 | Sandhu |
| 7,687,220 B2 | 3/2010 | Yamato et al. |
| 7,723,009 B2 | 5/2010 | Sandhu et al. |
| 7,754,518 B2 | 7/2010 | Koelmel et al. |
| 7,923,373 B2 | 4/2011 | Sandhu |
| 8,039,196 B2 | 10/2011 | Kim et al. |
| 8,083,953 B2 | 12/2011 | Millward et al. |
| 8,241,822 B2 | 8/2012 | Yamato et al. |
| 8,420,304 B2 | 4/2013 | Inatomi |
| 8,603,867 B2 | 12/2013 | Kim et al. |
| 2002/0192619 A1 | 12/2002 | Besek |
| 2002/0193619 A1 | 12/2002 | Crivello et al. |
| 2003/0084925 A1 | 5/2003 | Nakajima et al. |
| 2005/0056219 A1 | 3/2005 | Dip et al. |
| 2005/0215713 A1 | 9/2005 | Hessell et al. |
| 2006/0123658 A1 | 6/2006 | Izumi |
| 2006/0251989 A1 | 11/2006 | Breyta et al. |
| 2007/0037412 A1 | 2/2007 | Dip et al. |
| 2007/0224823 A1 | 9/2007 | Sandhu |
| 2007/0237697 A1 | 10/2007 | Clark |
| 2007/0238028 A1 | 10/2007 | Inatomi |
| 2008/0193658 A1* | 8/2008 | Millward ............ B81C 1/00031 427/401 |
| 2008/0311402 A1 | 12/2008 | Jung et al. |
| 2008/0318005 A1 | 12/2008 | Millward |
| 2009/0081827 A1 | 3/2009 | Yang et al. |
| 2009/0087664 A1 | 4/2009 | Nealey et al. |
| 2009/0181171 A1 | 7/2009 | Cheng et al. |
| 2009/0200646 A1 | 8/2009 | Millward et al. |
| 2009/0236309 A1 | 9/2009 | Millward et al. |
| 2009/0291398 A1 | 11/2009 | Horiuchi |
| 2010/0055621 A1 | 3/2010 | Hatakeyama et al. |
| 2010/0227276 A1 | 9/2010 | Mizuno |
| 2011/0033786 A1 | 2/2011 | Sandhu |
| 2011/0059299 A1 | 3/2011 | Kim et al. |
| 2011/0089412 A1 | 4/2011 | Fujimori et al. |
| 2011/0147984 A1 | 6/2011 | Cheng et al. |
| 2011/0147985 A1 | 6/2011 | Cheng et al. |
| 2011/0229120 A1 | 9/2011 | Takaki et al. |
| 2011/0272381 A1 | 11/2011 | Millward et al. |
| 2012/0046415 A1 | 2/2012 | Millward et al. |
| 2012/0046421 A1 | 2/2012 | Darling et al. |
| 2012/0077127 A1 | 3/2012 | Sills et al. |
| 2012/0088192 A1 | 4/2012 | Trefonas et al. |
| 2012/0273460 A1 | 11/2012 | Kang et al. |
| 2013/0189504 A1 | 7/2013 | Nealey et al. |
| 2014/0061154 A1 | 3/2014 | Kim et al. |
| 2014/0099583 A1 | 4/2014 | Holmes et al. |
| 2014/0154630 A1 | 6/2014 | Schmid et al. |

FOREIGN PATENT DOCUMENTS

| | | |
|---|---|---|
| KR | 20120133272 A | 12/2012 |
| WO | 03016209 A1 | 2/2003 |
| WO | 2008150673 A1 | 12/2008 |
| WO | 2012071330 A1 | 5/2012 |
| WO | 2012084558 A1 | 6/2012 |
| WO | 2012175343 A1 | 12/2012 |
| WO | 20120175342 A2 | 12/2012 |
| WO | 2013010730 A1 | 1/2013 |

OTHER PUBLICATIONS

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 2006, 9 pages.

Liu et al., "Integration of Block Copolymer Directed Assembly with 193 Immersion Lithography" American Vacuum Society, J. Vac. Sci. Technol. B 28(6), Nov./Dec. 2010, 5 pp.

Bielawski et al., "Regiospecific One-Pot Synthesis of Diaryliodonium Tetrafluoroborates from Arylboronic Acids and Aryl Iodides," J. Org. Chem. 73:4602-4607, 2008.

Cheng et al., "Developing Directly Photodefinable Substrate Guiding Layers for Block Copolymer Directed Self-Assembly (DSA) Patterning," Proc. of SPIE. 7972:79722I(1)-79722I(13), 2011.

Cheng et al., "Simple and Versatile Methods to Integrate Directed Self-Assembly with Optical Lithography Using a Polarity-Switched Photoresist," ACS Nano, 4(8):4815-4823, 2010.

Cheng, et al., "EUVL Compatible, LER Solutions using Functional Block Copolymers," Alternative Lithographic Technologies IV, Proc. of SPIE, vol. 8323, 2012, 11 pp.

Cho et al., "Polymer Bound Photobase Generators and Photoacid Generators for Pitch Division Lithography," Proc. of SPIE. 7972:797221(1)-797221(8), 2011.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Maki et al., "Photocleavable Molecule for Laser Desorption Ionization Mass Spectometry," J. Org. Chem. 72:6427-6433, 2007.

Padmanaban et al., "Application of Photodecomposable Base Concept to 193 nm Resists," Proc. of SPIE. 3999:1136-1146, 2000.

Ross et al., "Si-containing block copolymers for self-assembled nanolithography," J. Vac. Sci. Technol. B. 26 (6):2489-2494, 2008.

Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, III, and V) Chemistry: 10 Years of Development at the Medical University of Warsaw, Poland," Molecules. 5:1331-1371, 2000.

Weissman et al., "Recent advances in ether dealkylation," Tetrahedron. 61:7833-7863, 2005.

Gotrik et al., "Morphology Control in Block Copolymer Films Using Mixed Solvent Vapors," ACS Nano, 6(9):8052-8059, 2012.

Hammersky et al., "Self-Diffusion of a Polystyrene-Polyisoprene Block Copolymer," Journal of Polymer Science: Part B: Polymer Physics. 34:2899-2909, 1996.

Jung et al., "Orientation-Controlled Self-Assembled Nanolithography Using a Polystyrene-Polydimethylsiloxane Block Copolymer," Nano Lett. 7(7):2046-2050, 2007.

Jung et al., "A Path to Ultranarrow Patterns Using Self-Assembled Lithography," Nano Lett. 10:1000-1005, 2010.

(56) References Cited

OTHER PUBLICATIONS

Postnikov et al., "Study of resolution limits due to intrinsic bias in chemically amplified photoresists," J. Vac. Sci. Technol. B. 17(6):3335-3338, 1999.

Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.

Choi et al., "Square Arrays of Holes and Dots Patterned from a Linear ABC Triblock Terpolymer," ACS Nano, 6(9):8342-8348, 2012.

Foubert et al., "Impact of post-litho LWR smoothing processes on the post-etch patterning result," Proc. of SPIE, 7972:797213(1)-797213(10), 2011.

Tavakkoli K.G. et al., "Templating Three-Dimensional Self-Assembled Structures in Bilayer Block Copolymer Films," Science, 336:1294-1298, 2012.

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p., date unknown.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene-poly(4-vinylpyridine) in deoxycholic acid melt", Polymer, Elsevier Science Publishers B.V, GB, vol. 52, No. 18, Jul. 13, 2011, pp. 3994-4000.

Tang et al., Rapid formation of block copolymer thin film based on infrared laser irradiation, 2007, CLEO Pacific Rim 2007.

* cited by examiner

INTEGRATION OF ABSORPTION BASED HEATING BAKE METHODS INTO A PHOTOLITHOGRAPHY TRACK SYSTEM

CROSS-REFERENCE TO RELATED APPLICATIONS

This application is a continuation of co-pending U.S. patent application Ser. No. 14/211,215 filed Mar. 14, 2014 and entitled INTEGRATION OF ABSORPTION BASED HEATING BAKE METHODS INTO A PHOTOLITHOGRAPHY TRACK SYSTEM, which claims the benefit of and priority to prior filed Provisional Application Ser. No. 61/782,133 filed on Mar. 14, 2013, the disclosures of which are incorporated herein by reference in their entirety.

FIELD OF THE INVENTION

This disclosure is related to methods for integrating absorption based heating bake methods in directed self-assembly applications.

BACKGROUND OF THE INVENTION

Directed self-assembly ("DSA") processes use block copolymers to form lithographic structures. There are a host of different integrations for DSA (e.g., chemo-epitaxy, grapho-epitaxy, hole shrink, etc.), but in all cases the technique depends on the rearrangement of the block copolymer from a random, unordered state to a structured, ordered state that is useful for subsequent lithography. The morphology of the ordered state is variable and depends on a number of factors, including the nature of the block polymers, relative molecular weight ratio between the block polymers, and the annealing conditions. Common morphologies include line-space and cylindrical, although other structures may also be used. For example, other ordered morphologies include spherical, lamellar, bicontinuous gyroid, or miktoarm star microdomains.

Annealing of the block copolymer layer has traditionally been achieved by various methods known in the art, including, but not limited to: thermal annealing (either in a vacuum or in an inert atmosphere containing nitrogen or argon), solvent vapor-assisted annealing (either at or above room temperature), or supercritical fluid-assisted annealing. As a specific example, thermal annealing of the block copolymer can be conducted at an elevated temperature that is above the glass transition temperature (Tg), but below the degradation temperature (Td) of the block copolymer. However, to generate well-registered patterns, thermal annealing, solvent vapor-assisted annealing, and supercritical fluid-assisted annealing each have their own inherent limitations.

For example, thermal annealing of some block copolymers (e.g., polystyrene-b-polymethacrylate) may be accomplished in relatively short processing times. But to achieve reductions in critical dimensions and line edge roughness, the use of block copolymers with larger Flory-Huggins interaction parameter ($\chi$) may be required. But the higher $\chi$ block copolymers generally have slower self-assembly kinetics, and self-assembled pattern generation may take a few to tens of hours, thus detrimentally affecting throughput. Solvent vapor-assisted annealing can improve the kinetics of the self-assembly of higher $\chi$ block copolymers but involves the introduction of another component to the system with its own hardware and process constraints.

Accordingly, there is a need for new apparatus and methods for annealing block copolymers in DSA applications.

SUMMARY OF THE INVENTION

The present invention overcomes the foregoing problems and other shortcomings, drawbacks, and challenges of conventional annealing process for directed self-assembly applications. While the invention will be described in connection with certain embodiments, it will be understood that the invention is not limited to these embodiments. To the contrary, this invention includes all alternatives, modifications, and equivalents as may be included within the scope of the present invention.

According to an embodiment of the present invention, a method for patterning a layered substrate is provided. The method comprises a) forming a layer of a block copolymer; b) performing an annealing treatment of the layer of the block copolymer to affect microphase segregation such that self-assembled domains are formed; and c) annealing the layer of the block copolymer to refine or modify the microphase segregation, wherein at least one of the annealing treatment (b) and the annealing (c) is an absorption based heating method that comprises exposing at least a portion of the layer of the block copolymer to electromagnetic radiation to heat the exposed portion of the layer of the block copolymer to an annealing temperature in a range of 250° C. to 500° C.

According to another embodiment, a method of patterning a layered substrate is provided that comprises a) forming a layer of a block copolymer; b) performing a thermal annealing treatment of the layer of the block copolymer to affect microphase segregation such that self-assembled domains are formed; c) performing a metrology review of the layered substrate to identify defects and specific defect wafer location; and d) exposing the layer of the block copolymer at the specific defect wafer locations to electromagnetic radiation to heat the exposed portion of the layer of the block copolymer to an annealing temperature in a range of 250° C. to 500° C. to refine or modify the microphase segregation.

The above and other objects and advantages of the present invention shall be made apparent from the accompanying drawings and the descriptions thereof.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION

Apparatus and methods for incorporating an absorption based heating annealing technique within direct self-assembly ("DSA") applications are disclosed in various embodiments. However, one skilled in the relevant art will recognize that the various embodiments may be practiced without one or more of the specific details or with other replacement and/or additional methods, materials, or components. In other instances, well-known structures, materials, or operations are not shown or described in detail to avoid obscuring aspects of various embodiments of the present invention.

Similarly, for purposes of explanation, specific numbers, materials, and configurations are set forth in order to provide a thorough understanding. Nevertheless, the embodiments of the present invention may be practiced without specific details. Furthermore, it is understood that the illustrative representations are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
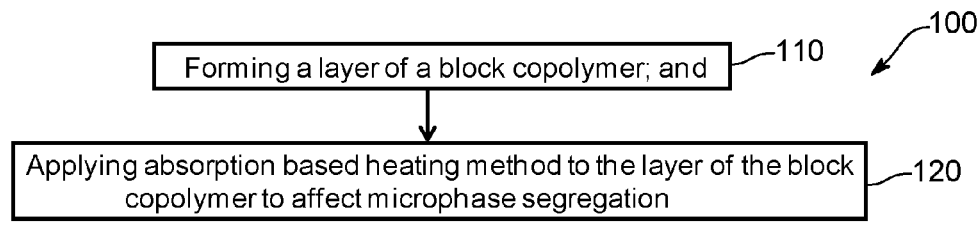
FIG. 1 is a flow chart illustrating a method of incorporating an absorption based heating method for annealing a layered substrate comprising a layer of a block copolymer, in accordance with an embodiment of the present invention.

In accordance with an embodiment of the present invention and in reference to the flow chart of FIG. 1, a method 100 for patterning a layered substrate is provided. The method 100 comprises a) forming a layer of a block copolymer (110) on a substrate; and b) annealing the layer of the block copolymer by applying an absorption based heating method (120). Optionally, a metrology review of the annealed layered substrate may be performed to identify or quantify areas of non-directed self-assembly, which upon exceeding a predetermined threshold value can initiate one or more additional annealing steps to refine or modify the microphase segregation of the block copolymers. In accordance with embodiments of the present invention, the one or more additional annealing steps may include an absorption based annealing step or a traditional annealing step, as further described below.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter, which is temperature dependent, and N is the total degree of polymerization for the block copolymer. According to embodiments of the present invention, the $\chi N$ value of one polymer block with at least one other polymer block in the larger polymer may be equal to or greater than about 10.5, at the annealing temperature.

As used herein, the term "block copolymer" means and includes a polymer composed of chains where each chain contains two or more polymer blocks as defined above and at least two of the blocks are of sufficient segregation strength (e.g. $\chi N > 10.5$) for those blocks to phase separate. A wide variety of block polymers are contemplated herein including diblock copolymers (i.e., polymers including two polymer blocks (AB)), triblock copolymers (i.e., polymers including three polymer blocks (ABA or ABC)), multiblock copolymers (i.e., polymers including more than three polymer blocks (ABCD, star copolymers, miktoarm polymers, etc.)), and combinations thereof.

According to an embodiment of the present invention, the directed self-assembly block copolymer is a block copolymer comprising a first polymer block and a second polymer block, where the first polymer block inherently has an etch selectivity greater than 2 over the second block polymer under a first set of etch conditions. According to one embodiment, the first polymer block comprises a first organic polymer, and the second polymer block comprises a second organic polymer. In another embodiment, the first polymer block is an organic polymer and the second polymer block is an organometallic-containing polymer. As used herein, the organometallic-containing polymer includes polymers comprising inorganic materials. For example, inorganic materials include, but are not limited to, metalloids such as silicon, and/or transition metals such as iron.

It will be appreciated that the total size of each block copolymer and the ratio of the constituent blocks and monomers may be chosen to facilitate self-organization and to form organized block domains having desired dimensions and periodicity. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains.

Moreover, the types of self-assembled microdomains formed by the block copolymer are readily determined by the volume fraction of the first block component to the second block components.

According to one embodiment, when the volume ratio of the first block component to the second block component is greater than about 80:20, or less than about 20:80, the block copolymer will form an ordered array of spheres composed of the second polymeric block component in a matrix composed of the first polymeric block component. Conversely, when the volume ratio of the first block component to the second block component is less than about 20:80, the block copolymer will form an ordered array of spheres composed of the first polymeric block component in a matrix composed of the second polymeric block component.

When the volume ratio of the first block component to the second block component is less than about 80:20 but greater than about 65:35, the block copolymer will form an ordered array of cylinders composed of the second polymeric block component in a matrix composed of the first polymeric block component. Conversely, when the volume ratio of the first block component to the second block component is less than about 35:65 but greater than about 20:80, the block copolymer will form an ordered array of cylinders composed of the first polymeric block component in a matrix composed of the second polymeric block component.

When the volume ratio of the first block component to the second block component is less than about 65:35 but is greater than about 35:65, the block copolymer will form alternating lamellae composed of the first and second polymeric block components.

Therefore, the volume ratio of the first block component to the second block component can be readily adjusted in the block copolymer in order to form desired self-assembled periodic patterns. According to embodiments of the present invention, the volume ratio of the first block component to the second block component is less than about 80:20 but greater than about 65:35 to yield an ordered array of cylinders composed of the second polymeric block component in a matrix composed of the first polymeric block component.

Block copolymers may be comprised of exemplary organic polymer blocks that include, but are not limited to, poly(9,9-bis(6'-N,N,N-trimethylammonium)-hexyl)-fluorene phenylene) (PFP), poly(4-vinylpyridine) (4PVP), hydroxypropyl methylcellulose (HPMC), polyethylene glycol (PEG), poly(ethylene oxide)-co-poly(propylene oxide) di- or multiblock copolymers, poly(vinyl alcohol) (PVA), poly(ethylene-co-vinyl alcohol) (PEVA), poly(acrylic acid) (PAA), polylactic acid (PLA), poly(ethyloxazoline), a poly (alkylacrylate), polyacrylamide, a poly(N-alkylacrylamide), a poly(N,N-dialkylacrylamide), poly(propylene glycol) (PPG), poly(propylene oxide) (PPO), partially or fully hydrolyzed poly(vinyl alcohol), dextran, polystyrene (PS), polyethylene (PE), polypropylene (PP), polyisoprene (PI), polychloroprene (CR), a polyvinyl ether (PVE), poly(vinyl acetate) ($PV_{Ac}$), poly(vinyl chloride) (PVC), a polyurethane (PU), a polyacrylate, an oligosaccharide, or a polysaccharide.

Block copolymers may be comprised of exemplary organometallic-containing polymer blocks that include, but are not limited to, silicon-containing polymers such as polydimethylsiloxane (PDMS), polyhedral oligomeric silsesquioxane (POSS), or poly(trimethylsilylstyrene (PTMSS), or silicon- and iron-containing polymers such as poly (ferrocenyldimethylsilane) (PFS).

Exemplary block copolymers include, but are not limited to, diblock copolymers such as polystyrene-b-polydimethylsiloxane (PS-PDMS), poly(2-vinylpyridine)-b-polydimethylsiloxane (P2VP-PDMS), polystyrene-b-poly(ferrocenyldimethylsilane) (PS-PFS), or polystyrene-b-poly-DL-lactic acid (PS-PLA), or triblock copolymers such as polystyrene-b-poly(ferrocenyldimethylsilane)-b-poly(2-vinylpyridine) (PS-PFS-P2VP), polyisoprene-b-polystyrene-b-poly(ferrocenyldimethylsilane) (PI-PS-PFS), or polystyrene-b-poly(trimethylsilylstyrene)-b-polystyrene (PS-PTMSS-PS). In one embodiment, a PS-PTMSS-PS block copolymer comprises a poly(trimethylsilylstyrene) polymer block that is formed of two chains of PTMSS connected by a linker comprising four styrene units. Modifications of the block copolymers is also envisaged, such as that disclosed in U.S. Patent Application Publication No. 2012/0046415, the entire disclosure of which is incorporated by reference herein.

Embodiments of the invention may also allow for the formation of features smaller than those that may be formed by block polymers alone or photolithography alone. In embodiments of the invention, a self-assembly material formed of different chemical species is allowed to organize to form domains composed of like chemical species. Portions of those domains are selectively removed to form temporary placeholders and/or mask features. A pitch multiplication process may then be performed using the temporary placeholders and/or mask features formed from the self-assembly material. Features with a pitch smaller than a pitch of the temporary placeholders may be derived from the temporary placeholders.

Moreover, because the block copolymer material is also used as a mask for patterning underlying layers, the copolymer material is selected not only on its self-assembly behavior, but also based on its etch selectivity between the polymer blocks. Accordingly, the self-assembly behavior of the block copolymers allows the reliable formation of very small features, thereby facilitating the formation of a mask with a very small feature size. For example, features having a critical dimension of about 1 nm to about 100 nm, about 3 nm to about 50 nm or about 5 nm to about 30 nm may be formed.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, or bicontinuous gyroid microdomains, where the molecular weight of the block copolymer dictates the sizes of the microdomains formed. The domain size or pitch period ($L_O$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure.

The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks.

In accordance with an embodiment, annealing of the block copolymer is performed by only applying an absorption based heating method. In accordance with another embodiment, annealing the layer of the block copolymer may be performed by any traditional or absorption based heating method to affect microphase segregation to form ordered domains, but then is subsequently followed by an absorption based heating method to refine or modify the microphase segregation. In accordance with another embodiment, annealing the layer of the block copolymer layer may be first performed by an absorption based heating method, but is then subsequently followed by a traditional annealing method. "Traditional" annealing methods include, but are not limited to, a single wafer bake plate under ambient or low $O_2$ (e.g., 50 ppm) conditions; a batch wafer bake furnace under ambient or low $O_2$ conditions; a single wafer solvent bake plate under a variety of solvent conditions; or a batch wafer bake furnace under a variety of solvent bake conditions.

As used herein, "absorption based heating" or "optical based heating" is based on the absorbance of radiation or electromagnetic energy that is rapidly converted to thermal energy. Absorption based heating allows for increased thermal ramp rates and thermal quenches, relative to traditional ovens, furnaces, or heated wafer chucks. These higher ramp rates/thermal quenches allow for a much wider operating range for time and temperature permutations, often allowing for significantly higher temperatures for a given layered material under less than ideal environment. Exemplary absorption based annealing temperatures may be in a range from about 100° C. to about 1000° C., for example about 200° C. to about 1000° C., about 500° C. to about 1000° C., about 800° C. to about 1000° C., about 200° C. to about 800° C., or about 400° C. to about 600° C. Other suitable absorption based annealing temperature may be in a range from about 100° C. to about 500° C., for example from about 250° C. to about 500° C., about 100° C. to about 400° C., about 200° C. to about 300° C., depending on the nature of the block copolymer.

As specific examples, optical absorption heating sources, such as LED, laser, ultraviolet, or broadband visible light may be used to heat the layer of the block copolymer to an elevated temperature that is about 50° C. or more above the intrinsic glass transition temperature (Tg), but below the order-disorder temperature (ODT) above which the block copolymer will no longer phase separate and also below the thermal degradation temperature (Td) of the block copolymer, as described in greater detail hereinafter.

As used herein, "intrinsic glass transition temperature" means the glass transition temperature of the block copolymer without the influence of water or other solvents. As known in the art, the presence of solvents lowers the temperature of the glassy transition of the solvent-containing mixtures.

As used herein, "thermal degradation temperature" means a temperature at which the block copolymer will undergo oxidative degradation under ambient oxygen levels. According to an embodiment of the present invention, the oxygen content in the surrounding atmospheres for the absorption based annealing process and the thermal quench are at a level equal to or less than about 50 ppm. The thermal degradation temperature of a given block copolymer at the desired ambient oxygen level can be ascertained by common methods, which includes but is not limited to, thermogravimetric analysis (TGA).

Optical based heating methods can also be used to replace traditional processing methods at many potential process steps within a photolithography process. Some traditional photolithography bake steps that it could replace are dehydration bake (to remove water on surface for better priming); bottom anti-reflective coating (BARC) bake (typically to crosslink the BARC to make insoluble to further resist process); photoresist bake (to remove majority of residual casting solvent from resist film); post exposure bake (PEB) (to facilitate chemical amplified resists, CAR, acid diffusion and chemical amplification kinetics); hard bake (to remove most residual solvent to improve etch performance); or thermal freeze bake (for lithography-freeze, lithography etch (LFLE) double patterning processes).

Figure 2:
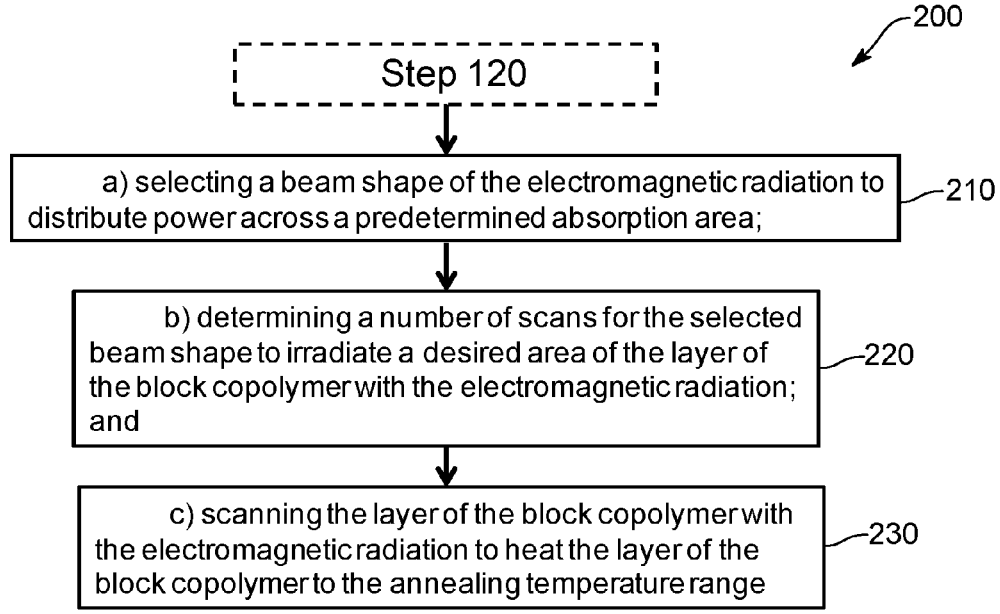
FIG. 2 is a flow chart illustrating another method of incorporating an absorption based heating method for annealing a layered substrate comprising a layer of a block copolymer, in accordance with an embodiment of the present invention.

According to embodiments of the present invention, the absorption based heating methods may be applied using a uniform single exposure (e.g., a flood exposure) to electromagnetic radiation for a first duration of time that is sufficient to rapidly heat the layer of the block copolymer above the $T_g$, which is followed by a sufficient time period of non-exposure to allow the layer of the block copolymer to cool below the $T_g$. In another embodiment, as shown in FIG. 2, the absorption based heating method (200) may include a) selecting a beam shape of the electromagnetic radiation to distribute power across a predetermined absorption area (210); b) determining a number of scans for the selected beam shape to irradiate a desired area of the layer of the block copolymer with the electromagnetic radiation (220); and c) scanning the layer of the block copolymer with the electromagnetic radiation to heat the layer of the block copolymer to the annealing temperature range (230).

Absorption based heating methods integrated into DSA processes provide the ability to reach elevated temperatures for shorter periods of times, which can minimize oxidative or thermal degradation of the BCP materials. Absorption based heating methods can be performed by many potential optical sources including, but not limited to, exposing the layered substrate to an electromagnetic radiation source selected from the group consisting of a broadband flash lamp, a light emitting diode; a laser, and a deep ultraviolet (DUV) flash lamp. Exemplary electromagnetic radiation sources include broadband flash lamp sources (e.g., middle ultraviolet (MUV) radiation, visible light radiation, or near infrared radiation (NIR), having a wavelength in a range from about 300 nm to about 1100 nm); light emitting diodes (typically emitting radiation having a wavelength in a range from about 500 nm to about 1100 nm); lasers, such as diode lasers (typically emitting radiation having a wavelength in a range from about 500 nm to about 1100 nm, or from about 800 nm to about 1000 nm), or $CO_2$ lasers (e.g., about 9.4 um or about 10.6 um, etc.); or deep ultraviolet (DUV) flash lamp sources (typically emitting radiation having a wavelength in a range from about 150 nm to about 200 nm).

The viability of any one electromagnetic source depends on the ability of a media to absorb the light at the intended wavelength and upon absorbing the light (photon) to convert absorbed light into thermal energy (phonon). The absorbing media can be, depending on light source being considered, but is not limited to: the substrate itself, typically Si; a modified substrate, to allow for absorption, such as heavily doped Si; or the use of a uniform absorbance layer, as described in U.S. Patent Application Publication No. 2013/0288487, the entirety of which is incorporated herein by reference in its entirety.

For some applications, the fluence, or power density, will be very important to ensure the correct time/temperature regime is obtained. Depending on the electromagnetic radiation source and its construction, the power density may be in a range from about 1 W/mm$^2$ to about 100 W/mm$^2$, or about 100 W/mm$^2$ to about 200 W/mm$^2$, or about 200 W/mm$^2$ to about 300 W/mm$^2$, or about 300 W/mm$^2$ to about 400 W/mm$^2$, or about 400 W/mm$^2$ to about 500 W/mm$^2$. Accordingly, the power density may be in a range from about 100 W/mm$^2$ to about 250 W/mm$^2$, or about 250 W/mm$^2$ to about 500 W/mm$^2$.

In accordance with an embodiment of the present invention, the absorption based heating provides an annealing temperature in a range of 250° C. to 1000° C. In accordance with another embodiment, the annealing temperature is in the range of 250° C. to 500° C., or 500° C. to 1000° C. While the BCP materials can withstand lower annealing temperatures without stringent control of oxygen level in the annealing environment, the microphase segregation at these lower temperatures to form ordered domains can take hours, or even longer. For a given polymer, the annealing time can be substantially shortened by going to higher temperatures. But polymer degradation may also increase, so oxygen levels need to be kept low to minimize polymer oxidation. Advantageously, polymer thermal degradation has shown no memory/cumulative effect of previous thermal spike processes, so long as spike temperature is below some thermal degradation threshold associated with the spike dwell time. Thermal diffusion effects within any substrate begin to limit intermediate thermal dwell times that can be achieved (ultimately creating a bimodal thermal dwell time distribution). Accordingly, absorption based heating thermal profile engineering can be used to give the thermodynamic processes more time and thus provide a higher probability of achieving 100% of desired directed self-assembly while still targeting a desire temperature to drive a given chi and thus a given morphology without leading to thermal decomposition.

Depending on various factors, e.g., flood exposure, repeated scan exposure, or rastering exposure; the power density (fluence) of the source; the absorbance efficiency of the layered substrate; and the desired annealing temperature, the first duration of exposure may be performed for about 0.1 milliseconds to about 10 seconds. For example, the first duration of exposure may be 0.4 milliseconds to about 10 seconds, about 0.1 milliseconds to about 5 seconds, about 0.4 milliseconds to about 5 seconds, about 1 second to about 10 seconds, or about 1 second to about 5 seconds.

In accordance with an embodiment, the exposure to electromagnetic radiation is performed at a power density in a range from 1 W/mm$^2$ to 100 W/mm$^2$ for a duration of time to provide the annealing temperature in the desired range. In another embodiment, the exposure to electromagnetic radiation is performed at a power density in a range from 250 W/mm$^2$ to 500 W/mm$^2$ for a duration of time to provide the annealing temperature.

The exposing duration may also be performed over a series of short exposures to provide an incrementally facilitated annealing of the layer of the block copolymer. For example, rastering an electromagnetic radiation beam over time ranges from about 10 milliseconds to about 50 milliseconds with about 4 to about 200 passes, may provide a cumulative absorption based annealing treatment in a range from about 40 milliseconds to about 10 seconds. In another example, rastering an electromagnetic radiation beam over time ranges from about 10 milliseconds to about 50 milliseconds with about 4 to about 20 passes, may provide a cumulative absorption based annealing treatment in a range from about 40 milliseconds to about 1 second.

The cooling off period or "thermal quench" period between two or more absorption based heating treatments may be a passive process or assisted by utilizing an exterior cooling process. According to an embodiment of the present invention, thermally quenching the annealed layered substrate may be performed in several manners. The thermal quenching may comprise at least one of reducing a pressure of the second atmosphere, flowing convective gas around the layered substrate, contacting the layered substrate with a wafer chuck in communication with a chiller unit, and/or contacting the layered substrate with cooling arms. With respect to the convective gas, the gas may comprise nitrogen, argon, or helium, for example. The quenching may also comprise use of a thermoelectric Peltier device. The quenching step may occur over a duration of time equal to or less than about 30 seconds to about 5 minutes and/or at a rate greater than or equal to 50° C./minute. With the example of PS-PDMS, the layered substrate may be quenched from a temperature of 340° C. to a temperature of 250° C. in 1 minute (i.e., at a rate of 90° C./minute). The quenching atmosphere may comprise a cooling chamber 14, specifically a cooling Front Opening Unified Pod (FOUP), a wafer boat, or a wafer handler, for example.

Once the layered substrate has cooled to a desired quenching temperature, an optical metrology review of the layered substrate may be performed to identify or quantify regions of non-uniformity or defects. The term "defect" or "defects" as used herein refers to any unwanted discontinuity in the translational, orientational, or chemical compositional order of a pattern. For example, a defect can be an unwanted notch, crack, bulge, bend or other physical discontinuity in the surface feature of the pre-pattern, or a chemical compositional change in a surface area of a pre-pattern. In another example, when the block copolymer pattern is defined by alternating lamellae, it may be desirable that the lamellae in such a block copolymer pattern must be aligned along the same direction in order for the pattern to be considered defect-free. Defects in the lamellar patterns can have various forms, including dislocation (i.e., line defects arising from perturbations in the translational order), disclination (i.e., line defects arising from discontinuities in the orientational order), and the like. Although it is generally desirable to minimize defects, no restriction is placed on the number of defects per unit area in the pre-pattern or block copolymer pattern formed thereon.

Exemplary metrology methods include, but are not limited to, techniques that compare color variation of the inspected layered substrate to a baseline sample of the typical color for a given product or photolayer. This baseline sample (hereinafter referred to as the "color baselist" or "baselist") may be composed of data from a collection of a predetermined number of different layered substrates. Once the baselist is complete, multiple parameters can be calculated that may represent information or characteristics such as average color, flatness, and properties of the die patterns. The information derived from the metrology review may include a classification of the defect; and/or an identification of the defect as a systematic defect or a nuisance defect. Another aspect of the metrology review relates to a computer-implemented method for binning defects detected on layered substrate. The metrology review may also include comparing one or more characteristics of the defects to one or more characteristics of DSA defects and one or more characteristics of non-DSA defects. Automated macro defect inspectors (also known as ADIs), such as those devices commercially available from Tokyo Electron or KLA-Tencor, may be utilized for defect evaluation.

Thus, in accordance with another embodiment of the invention, absorption based annealing processes may be used to correct DSA-related defects. Layered substrates that exceed a predetermined quantity of defects, or having regions of high density of defects, may be subjected to further absorption based annealing treatments, either globally or locally with a targeted beam. Using a computer-implemented method for binning defects can permit a localized or isolated exposure of the electromagnetic radiation to the defect area to correct the DSA-related defect. In an embodiment, the absorption based heating tool receives input and completes one or more programmed, selective scans for a defect absorption based heating anneal step.

Figure 3:
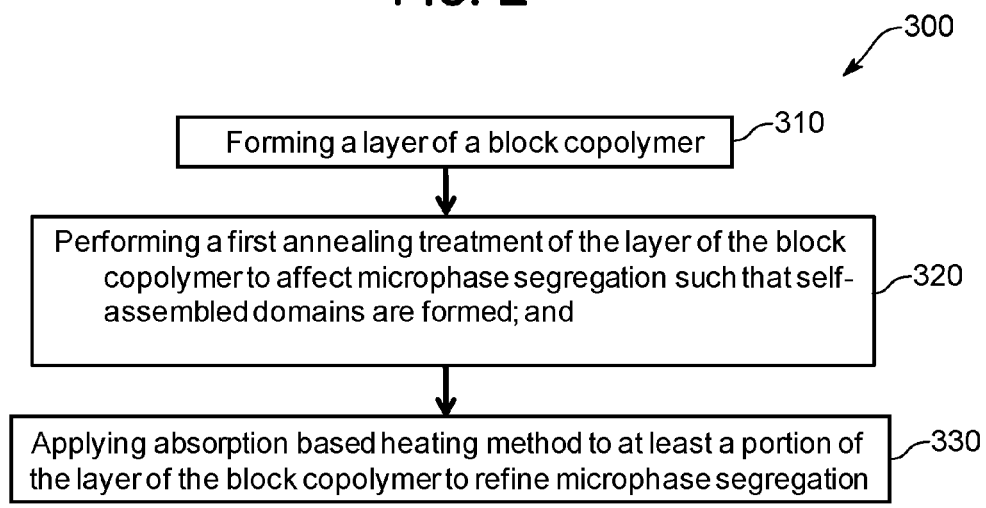
FIG. 3 is a flow chart illustrating another method of incorporating an absorption based heating method for annealing a layered substrate comprising a layer of a block copolymer, in accordance with an embodiment of the present invention.

Additionally, as shown in FIG. 3, in another embodiment, a method of patterning a layered substrate (300) is provided, the method comprising forming a layer of a block copolymer (310); performing a first annealing treatment of the layer of the block copolymer to affect microphase segregation such that self-assembled domains are formed (320); and applying an absorption based heating method to at least a portion of the layer of the block copolymer to refine or modify microphase segregation (330). In accordance with this embodiment, the first annealing step may be an absorbance based heating process, or another annealing method such as any one or more traditional annealing methods. Exemplary traditional annealing methods include thermal annealing (either in a vacuum, in a low oxygen atmosphere, or in an inert atmosphere, such as nitrogen or argon), solvent vapor-assisted annealing (either at or above room temperature), or supercritical fluid-assisted annealing As a specific example, thermal annealing of the block copolymer may be conducted by exposing the block copolymer in an oven or furnace to an elevated temperature that is above the glass transition temperature ($T_g$), but below the thermal degradation temperature ($T_d$) of the block copolymer. The oxygen content of the annealing atmosphere may be controlled to be less than about 100 ppm, less than about 50 ppm, less than about 40 ppm, less than about 30 ppm, or less than about 20 ppm, for example. Other conventional annealing methods not described herein may also be utilized.

In a further aspect of the two step anneal process of method 300, the second anneal step may also provide: 1) redundancy to ensure near 100% direct self-assembly as described above; 2) allow for shorter annealing process overall cycle time; 3) depending on absorption based heating method, e.g. small laser beam exposure method, for the possibility of mixed morphology within the same exposure die; or 4) tailoring a block co-polymer etch selectivity improvement, if not targeting a goal of complete elimination of breakthrough/clean-up etch step (prior to transfer).

Specific to the mixed morphology or order-to-order transition (OOT) two-step anneal aspect, the desired mixed morphology could be acquired by two complementary approaches. In a first mixed morphology embodiment, a solvent-assisted anneal method is utilized in the first anneal step (320), wherein the block copolymer is assembled to a first morphology, which is dictated by ambient solvent concentration, partial pressure, and block co-polymer fraction. The second anneal step (330) is performed by exposing a subset of any exposure die's area to a controlled absorption based heating method (e.g. a small rastering laser beam exposure) to induce a transformation from the first morphology to a second morphology only in this subset area.

In a second OOT embodiment, the fact that the Flory-Huggins interaction parameter ($\chi$) is temperature dependent ($\chi$ goes down as temperature goes up), along with the fact that many blocked copolymers go through several phase transitions through $\chi$ at a given block co-polymer fraction are exploited. Accordingly, in this second OOT embodiment, the first annealing treatment (320) is performed at a first anneal temperature to affect microphase segregation to a first morphology. In one embodiment, a non-solvent based annealing step may be used. Subsequent to this first annealing treatment, a second annealing treatment (330) is performed using a controlled absorption based heating method on a subset of any exposure die's area at a second anneal temperature, which is significantly higher than the first anneal temperature. The significantly higher second anneal temperature induces a transformation from the first morphology to a second morphology only in this subset area. In one embodiment, the difference between the first and the second anneal temperatures is equal to or greater than about 50° C., equal to or greater than about 75° C., equal to or greater than about 100° C., or equal to or greater than about 150° C.

In either OOT embodiment, the second annealing treatment (330) may comprise a rastering laser beam exposure, for example.

On the other hand, using the two-step heating process can be used to improve etch selectivity between the polymer blocks of the block copolymer. In this embodiment, the first annealing treatment (320) is performed at a first anneal temperature to affect microphase segregation to a first morphology. This first annealing treatment may be a traditional anneal process, an absorption base anneal process, or a combination thereof. After the block copolymer has achieved the desired first morphological state, an absorption based heating method is applied to a subset of any exposure die's area under appropriate conditions (e.g., temperature, fluence, duration, etc.) to improve polymer block etch selectivity. In another aspect, the appropriate combination of block copolymer and absorption base heating method may completely eliminate having to perform a breakthrough/clean-up etch step.

In a non-limiting example, a PS:PMMA block copolymer system can be annealed at a first anneal to induce self-assembly. Subjecting the annealed layered substrate to an absorption based heating method comprising a UV light source will induce cross-linking of the PS polymer block. However, using the UV light source at a sufficient fluence and duration heats the exposed region to a temperature greater than the $T_d$ of the PMMA polymer, which is less than the $T_d$ of PS. Accordingly, the high temperature/short time nature of the UV absorption based heating method would facilitate PMMA decomposition but not significantly decompose the PS. In this regard, UV absorption based heating method of this embodiment is analogous to an isopropanol (IPA) wet development step, which is commonly used for this purpose. However, even if complete removal of PMMA is not achieved, partially removing it will result in less PMMA that would need to be removed in a subsequent etch step, and gives a larger/improved PS:PMMA etch selectivity process window. It should be appreciated that while a PS:PMMA case is described, this embodiment is not limited to this system only. For example, a silylated PMMA branch, which would provide a higher $\chi$ material, would also undergo thermal decomposition of the silylated PMMA polymer block under similar conditions.

While the present invention has been illustrated by a description of one or more embodiments thereof and while these embodiments have been described in considerable detail, they are intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of patterning a layered substrate, comprising:
   a) forming a layer of a block copolymer;
   b) performing an annealing treatment of the layer of the block copolymer to affect microphase segregation such that self-assembled domains are formed; and
   c) thereafter, annealing the layer of the block copolymer to refine or modify the microphase segregation to correct one or more defects in the self-assembled domains,
   wherein at least the annealing (c) is an absorption based heating method that comprises exposing at least a portion of the layer of the block copolymer to electromagnetic radiation to heat the exposed portion of the layer of the block copolymer to an annealing temperature in a range of 250° C. to 500° C.

2. The method of claim 1, wherein the annealing treatment (b) comprises one of a single wafer bake on a heating plate, a batch wafer bake in a furnace, a single wafer solvent bake on a heating plate, or a batch wafer solvent bake in a furnace.

3. The method of claim 2, wherein the annealing treatment b) is performed at an annealing temperature less than the annealing temperature of the annealing c).

4. The method of claim 1, wherein the exposure to electromagnetic radiation is performed at a power density in a range from 1 W/mm$^2$ to 100 W/mm$^2$ for a duration of time in a range from 1 second to 10 seconds.

5. The method of claim 1, wherein the absorption based heating method is provided by exposure to an electromagnetic radiation source selected from the group consisting of a broadband flash lamp, a light emitting diode; a laser, and a deep ultraviolet (DUV) flash lamp.

6. The method of claim 5, wherein the electromagnetic radiation source is the laser, which is selected from a diode laser emitting electromagnetic radiation having a wavelength in a range from 500 nm to 1100 nm, or a carbon dioxide laser emitting electromagnetic radiation having a wavelength of 9.4 μm or 10.6 μm.

7. The method of claim 6, wherein the laser is a diode laser emitting electromagnetic radiation having a wavelength in a range from 800 nm to 1000 nm.

8. The method of claim 1, wherein the annealing c) of the layer of the block copolymer comprises:
   a) selecting a beam shape of the electromagnetic radiation to distribute power across a predetermined absorption area;
   b) determining a number of scans for the selected beam shape to irradiate a desired area of the layer of the block copolymer with the electromagnetic radiation; and
   c) scanning the layer of the block copolymer with the electromagnetic radiation to heat the layer of the block copolymer to the annealing temperature range.

9. The method of claim 8, wherein the scanning the layer of the block copolymer with the electromagnetic radiation is performed with a single pass.

10. The method of claim 9, wherein the scanning the layer of the block copolymer with the electromagnetic radiation is performed with a repetitive scan or by offset raster scanning.

11. The method of claim 1, wherein the annealing treatment b) is a thermal annealing treatment, the method further comprising, after the annealing treatment b) and prior to annealing c): performing a metrology review of the layered substrate to identify defects and specific defect wafer location, wherein the annealing c) includes exposing the layer of the block copolymer at the specific defect wafer locations to the electromagnetic radiation to heat the exposed portion of the layer of the block copolymer to the annealing temperature.

12. The method of claim 11, wherein exposing the layer of the block copolymer to electromagnetic radiation is performed at a power density in a range from 1 W/mm$^2$ to 100 W/mm$^2$ for a duration of time in a range from 1 second to 10 seconds.

13. The method of claim 11, wherein the thermal annealing treatment b) comprises a single wafer bake on a heating plate; a batch wafer bake in a furnace; a single wafer solvent bake on a heating plate; or a batch wafer solvent bake in a furnace.

14. The method of claim 13, wherein the thermal annealing treatment b) is performed at an annealing temperature less than the annealing temperature of the exposing to electromagnetic radiation.

15. The method of claim 11, wherein the exposing to electromagnetic radiation heats the specific defect wafer locations to a temperature sufficient to degrade a first polymer block of the block copolymer.

16. The method of claim 15, wherein degrading the first polymer block of the block copolymer increases an etch selectivity of the first polymer block over a second polymer of the block copolymer.

17. The method of claim 15, wherein degrading the first polymer block of the block copolymer substantially removes the first polymer block.

18. The method of claim 11, wherein the exposing to electromagnetic radiation comprises:
   i) selecting a beam shape of the electromagnetic radiation to distribute power across the specific defect wafer locations;
   ii) determining a number of scans for the selected beam shape to irradiate the specific defect wafer locations with the electromagnetic radiation; and
   iii) scanning the layer of the block copolymer with the electromagnetic radiation to heat the specific defect wafer locations of the layer of the block copolymer to the annealing temperature range.

* * * * *

UNITED STATES PATENT AND TRADEMARK OFFICE
CERTIFICATE OF CORRECTION

PATENT NO. : 9,613,801 B2
APPLICATION NO. : 14/858568
DATED : April 4, 2017
INVENTOR(S) : Michael A. Carcasi et al.

It is certified that error appears in the above-identified patent and that said Letters Patent is hereby corrected as shown below:

In the Drawings

On FIG. 1, box #120, Line 2, "copolymer to affect" should read --copolymer to effect--.

On FIG. 2, box #320, Line 2, "copolymer to affect" should read --copolymer to effect--.

In the Specification

In Column 2, Lines 7-8, "conventional annealing process" should read --conventional annealing processes--.

In Column 2, Line 20, "block copolymer to affect" should read --block copolymer to effect--.

In Column 2, Line 33, "block copolymer to affect" should read --block copolymer to effect--.

In Column 5, Lines 23-24, "fluorene phenylene)" should read --fluorene phenylene--.

In Column 5, Line 59, "Modifications of the" should read --Modification of the--.

In Column 7, Line 10, "heating method to affect" should read --heating method to effect--.

In Column 7, Line 40, "absorption based annealing temperature" should read --absorption based annealing temperatures--.

In Column 8, Lines 53-54, "9.4 um or about 10.6 um, etc.)" should read --9.4 µm or about 10.6 µm, etc.--.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,613,801 B2

In Column 9, Line 36, "targeting a desire temperature to drive a given chi and thus" should read --targeting a desired temperature to drive a given $\chi$ and thus--.

In Column 11, Line 20, "block copolymer to affect" should read --block copolymer to effect--.

In Column 12, Line 6, "anneal temperature to affect" should read --block copolymer to effect--.

In Column 12, Line 28, "temperature to affect" should read --temperature to effect--.

In Column 12, Line 30, "an absorption base anneal" should read --an absorption based anneal--.

In Column 12, Line 37, "block copolymer and absorption base heating" should read --block copolymer and absorption based heating--.

In Column 12, Line 67, "they are intended" should read --they are not intended--.

In the Claims

In Column 13, Line 13, Claim 1, "block copolymer to affect" should read --block copolymer to effect--.

In Column 13, Line 39, Claim 5, "a light emitting diode;" should read --a light emitting diode,--.